(12) United States Patent
Hayashi et al.

(10) Patent No.: US 6,495,934 B1
(45) Date of Patent: Dec. 17, 2002

(54) METHOD OF MANUFACTURING LINEAR MOTOR, LINEAR MOTOR, STAGE APPARATUS EQUIPPED WITH LINEAR MOTOR AND EXPOSURE APPARATUS

(75) Inventors: Yutaka Hayashi, Yokohama (JP); Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/658,015

(22) Filed: Sep. 8, 2000

Related U.S. Application Data

(63) Continuation-in-part of application No. PCT/JP99/01115, filed on Mar. 9, 1999.

(30) Foreign Application Priority Data

Mar. 13, 1998 (JP) .............................. 10-063645
Dec. 11, 1998 (JP) .............................. 10-353647

(51) Int. Cl.$^7$ .............................................. H02K 41/00
(52) U.S. Cl. .............................. 310/12; 310/42; 29/596
(58) Field of Search ........................... 310/12, 13, 14, 310/42; 29/596, 598; 336/185, 199, 200, 205, 206, 207, 208

(56) References Cited

U.S. PATENT DOCUMENTS

| 4,758,750 A | | 7/1988 | Itagaki et al. ................ 310/13 |
| 5,098,503 A | * | 3/1992 | Drake ........................ 156/299 |
| 5,703,417 A | * | 12/1997 | Kelly ........................... 310/12 |
| 5,703,420 A | * | 12/1997 | Kamata et al. ............... 310/54 |

FOREIGN PATENT DOCUMENTS

| JP | 59-119786 | 8/1984 |
| JP | A 4-125910 | 4/1992 |
| JP | A 5-184093 | 7/1993 |
| JP | 5-80177 | 10/1993 |
| JP | A 7-177722 | 7/1995 |
| JP | A 8-172765 | 7/1996 |

\* cited by examiner

*Primary Examiner*—Nestor Ramirez
*Assistant Examiner*—Judson H. Jones
(74) *Attorney, Agent, or Firm*—Oliff & Berridge, PLC

(57) ABSTRACT

A coil frame of an armature coil unit constituting a linear motor comprises a pair of holding portions and a connection portion that connects these holding portions to each other, and grooves that holds ends of the respective flat coils are formed at an interval corresponding to an array interval of permanent magnets.

16 Claims, 14 Drawing Sheets

FIG. 11A
FIG. 11B
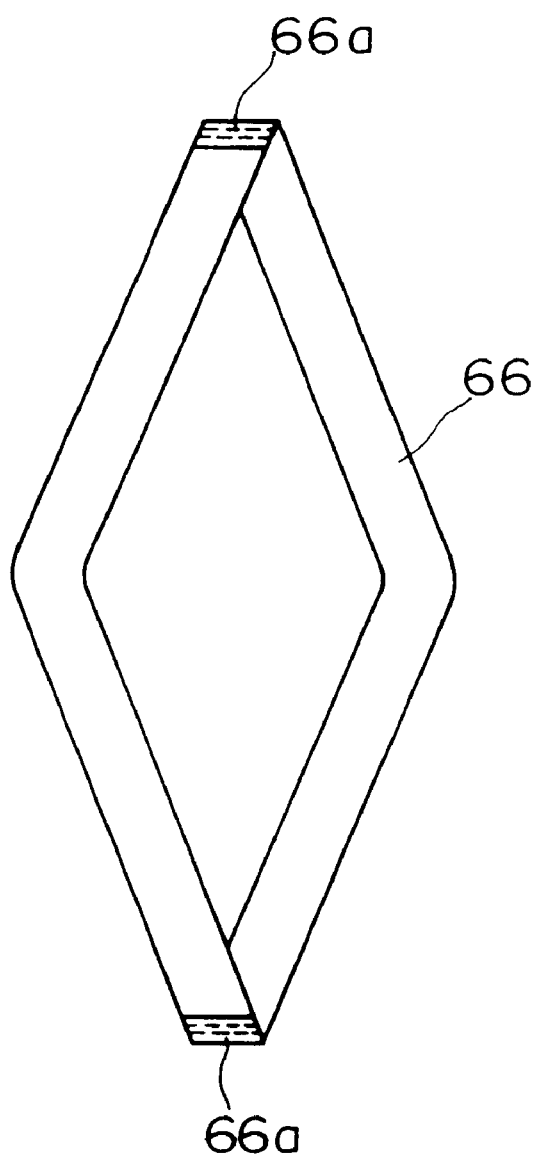
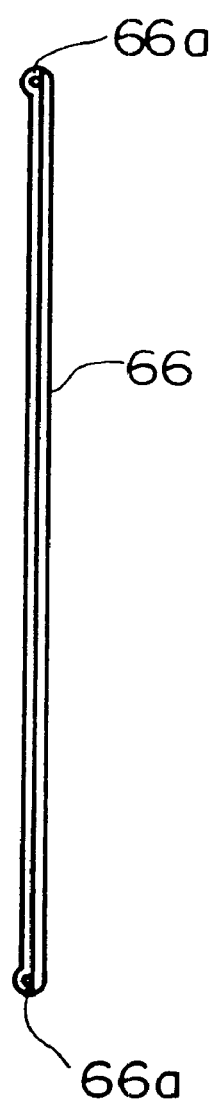

FIG. 12A
FIG. 12B
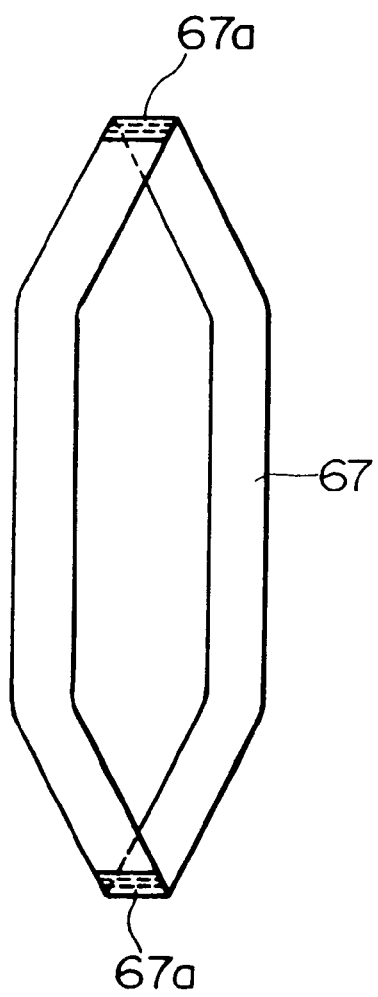
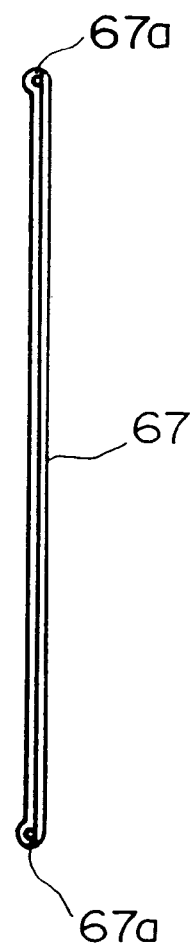

METHOD OF MANUFACTURING LINEAR MOTOR, LINEAR MOTOR, STAGE APPARATUS EQUIPPED WITH LINEAR MOTOR AND EXPOSURE APPARATUS

This is a Continuation of, International Appln. No. PCT/JP99/01115 filed Mar. 9, 1999 which designated the U.S.

FIELD OF THE INVENTION

The present invention relates to a method of manufacturing a linear motor suitably used for a driving power source for a stage holding a substrate in a projection exposure apparatus used in, for example, semiconductor manufacturing steps; a linear motor; a stage apparatus equipped with the linear motor; and an exposure apparatus.

BACKGROUND OF THE INVENTION

In a photolithography step which occupies an important place in manufacturing steps for manufacturing devices such as semiconductor devices and liquid crystal devices, a projection exposure apparatus has been heretofore employed, which projects and exposes via a projection optical system a circuit pattern of a photomask or a reticle (hereinafter simply referred to as a reticle) onto a substrate such as a wafer and a glass plate on which photosensitive agent is coated. Recently, as the integration density of the semiconductor integrated circuits continues to increase, a reduction projection type exposure apparatus, called a stepper, adopting a step and repeat system has been the primary projection exposure apparatus. The reduction projection type exposure apparatus sequentially projects and transfers a pattern onto a plurality of exposure areas on a substrate while sequentially moving the substrate.

In such a stepper, every time a projection and a transfer are performed while sequentially moving a substrate, the substrate needs to be positioned precisely. Accordingly, a stage for holding, moving, and positioning the substrate is provided. The stage, in which a movable stage making it possible to move the held substrate at least in two directions is provided, and a translatory driving mechanism is in heavy usage as a driving power source for the movable stage.

The translatory driving mechanism includes one which converts a rotary motion to a translatory motion by use of a rotary motor, and another using a translatory type linear motor. Particularly, because the linear motor has a simple structure, a small number of parts, and offers low frictional resistance, the linear motor has come to be a principle driving power source for a mechanism which must perform precise positioning.

The linear motor is composed of a permanent magnet unit and an armature coil unit, which allows the permanent magnet unit and the armature coil unit to move relative to each other, thus generating a propulsive force.

As shown in FIG. 13, there has been heretofore an armature coil unit 2 of a linear motor 1, which has a structure in which a plurality of coil bodies 3 are arrayed.

Each of the coil bodies 3 is constructed by winding up a wire into an almost rectangular shape when viewed sideways, and has an opening portion 3a in its central portion. The plurality of coil bodies 3 are positioned relative to a fitting plate 4 by inserting each opening portion 3a into corresponding one of the protrusions 4a formed so as to correspond to each opening portion 3a.

Also a technology to achieve high performance of the linear motor by increasing the occupation rate (density) of the armature coil unit for a magnetic gap of the permanent magnet unit has been recently proposed. For example, in the technology disclosed in Japanese Unexamined Patent Application, First Publication No. Hei 8-168229, a linear motor using a flat coil is proposed.

As shown in FIG. 14A, a linear motor 5 proposed in the above publication is schematically constituted by permanent magnets 7 and 7 held by a magnet frame 6 so as to face each other with a predetermined interval therebetween, and an armature coil unit 8 disposed between the permanent magnets 7 and 7. The armature coil unit 8 has a constitution in which flat-shaped coils 9 adheres to both planes of a fitting plate 8a. As shown in FIG. 14B, each coil 9 is formed to be flat-shaped by bending spirally a band-shaped coil which is wound into a rectangle or a parallelogram having a long side. Each coil 9 is positioned by a pin 8b provided on a fitting plate 8a.

However, in the foregoing conventional linear motor 1 shown in FIG. 13, the following problems exist.

First, in the linear motor 1 shown in FIG. 13, the positioning precision of each coil body 3 in the array direction of the plurality of coil bodies 3 is important. Specifically, as shown in FIG. 15, when there are external shape dimension errors among the coil bodies 3, an array interval of the plurality of coil bodies 3 arrayed deviates relatively from an array interval of the permanent magnets 7 with an accumulation of the errors. When there is an error between the array interval of the permanent magnets 7 and the array interval of the coil bodies 3, unevenness occurs in a propulsive force generated in the linear motor 1, thus influencing performance of the linear motor 1. As a countermeasure for this, though the external dimension precision of each coil body 3 must be increased, the increase in the external dimension precision results in an increase in the coil manufacturing cost.

In addition, in the linear motor 1 shown in FIG. 13, since the opening portion 3a is formed in each coil body 3, the occupation rate (density) of the coil body 3 for a magnetic gap of the permanent magnet unit is lowered in the opening portion 3a. As a result, there is the problem that an efficiency of the linear motor 1 is lowered.

On the other hand, in the linear motor 5 shown in FIG. 14, since the coil 9 equivalent to one phase is wound all in one, the problem owing to the deviation of the array interval created in the linear motor 1 shown in FIG. 13 can be avoided. However, in the linear motor 5 shown in FIG. 14, the fitting plate 8a as well as the coil 9 are interposed between the permanent magnets 7 and 7, and the occupation rate of the coil 9 for the magnetic gap of the permanent magnets 7 and 7 is lowered by the fitting plate 8a, so that efficiency of the linear motor 1 is still influenced. In addition, there is also the problem that such a coil 9 requires a large scale winding apparatus for manufacturing it.

The present invention was made considering the above described circumstances, and the subject of the present invention is to provide a method of manufacturing a linear motor capable of exerting high and stable performance, a linear motor, a stage apparatus equipped with the linear motor, and an exposure apparatus.

DISCLOSURE OF THE INVENTION

The invention according to a first aspect is a linear motor (R1) for allowing a movable body to move by its electromagnetic force, the linear motor (R1) comprising an armature coil (23), wherein the armature coil (23) comprises a plurality of coil bodies (25) and a frame (24) for holding these coil bodies (25) so as to array the coil bodies in one direction, and a positioning portion (28) for holding an end of each coil body (25) at a determined interval along the one direction formed in the frame (24).

With such a structure, the end of each coil body (25) is held by a groove (28) formed in the frame (24), whereby the plurality of coil bodies (25) are positioned at a determined interval.

In the linear motor (R1) described in the first aspect, the invention of a second aspect is characterized in that a notch (31) for passing a wire (C) of each coil body (25) therethrough is formed in the frame (24), and each coil body (25) is connected to one another in the outside of the frame (24).

As described above, the wire (C) of the coil body (25) is drawn out from the notch (31) to the outside of the frame (24), whereby connections of the coil bodies (25) of the same phase can be made outside the frame (24).

In the linear motor (R1) of the second aspect, the present invention of a third aspect of the present invention is characterized in that the notch (31) is formed so as to correspond to the positioning portion (28) formed in the frame (24), and a wire (C) from the end of the coil body (25) held by the positioning portion (28) is passed therethrough.

With such a structure, the notch (31) is formed for each coil body (25).

In the linear motor (R2) of the first to third aspects, the invention of a fourth aspect of the present invention is characterized in that a step portion (38) for holding the plurality of coil bodies (25, 25') so as to superimpose them thereon is formed in the positioning portion (28, 28').

With such a structure, the coil bodies (25, 25') plurally layered can be held by one frame (34).

In the linear motor (R3) of the first to fourth aspects, the invention of a fifth aspect is characterized in that the armature coil (43) is formed by gluing the plurality of frames (24) to each other.

Thus, with regard to the armature coil (43), the plurality of coil bodies (25) held by each frame (24) are constituted by superimposing them.

In the linear motor (R1) of the first to fifth aspects, the invention of a sixth aspect is characterized in that the coil body (25) has a flat polygon shape.

By forming the coil body (25) to the flat shape as described above, it is possible to increase an occupation rate of the armature coil (23) in a gap of a permanent magnet (22).

In the linear motor (R4) of the first to sixth aspects, the invention according of a seventh aspect of the present invention is characterized in that the coil body (55) has a shape obtained by performing winding that is almost cylindrical.

As described above, by holding the coil body (55) having the shape obtained by performing the winding that is almost cylindrical to the groove (58) formed in the frame (54), the same effect as those described above can be obtained also in the coil body (55) having the shape obtained by performing the winding so as to be almost cylindrical, that is, in the conventional type coil body (55).

In the linear motor (R1) of the first to seventh aspects, the invention of the eighth aspect is characterized in that the frame (24) has a pair of holding portions (26) extending along the one direction so as to be apart from each other by a predetermined interval, and the connection portion (27) for connecting these holding portions (26) to each other in both ends thereof, and the plurality of grooves (28) are formed in each of the holding portions (26) at an interval corresponding to the array interval of the permanent magnets (22).

With such a structure, the coil body (25) is held between the pair of holding portions (26). Moreover, by disposing the holding portion (26) at the position which does not interfere with the magnetic force line of the permanent magnets (22), only for the coil body (25) exists between the permanent magnets (22).

In the linear motor of the first to eighth aspects, the invention of a ninth aspect is characterized in that among constituent components constituting the coil fixing frame (70) for holding the armature coil (23), the can (71) for forming a coolant path to cool the coil body (25), and the armature coil (23), all of the constituent components except for the coil body (25) are formed of ceramics, engineering plastic or austenite stainless steel.

The invention of a tenth aspect is a linear motor (R1) which allows a movable body to move by an electromagnetic force, the linear motor comprising: an armature coil unit (23) having a plurality of coil bodies (25) and a frame-shaped holding member (24) for holding these coil bodies (25) so as to array the coil bodies (25).

With such a structure, the plurality of coil bodies (25) are positioned with respect to the holding member (24) with a high precision.

In the linear motor (R1) of the tenth aspect, the invention of a eleventh aspect is characterized in that the holding member (24) holds the plurality of coil bodies (25) along a predetermined direction.

Thus, the plurality of coil bodies (25) are positioned with respect to the holding member (24) along the predetermined direction with a high precision.

In the linear motor (R1) of the tenth aspect, the invention of a twelfth aspect is characterized in that the holding member (24) has positioning portions (28) formed at a predetermined interval to position the plurality of coil bodies (25).

With such a structure, the plurality of coil bodies (25) are positioned with respect to the holding member (24) at a predetermined interval with a high precision.

In the linear motor (R1) of the twelfth aspect, the invention of a thirteenth aspect is characterized in that the positioning portions (28) of the holding member (24) are formed so as to conform to a shape of an end of each of the plurality of coil bodies (25).

Thus, the plurality of coil bodies (25) are positioned with respect to the holding member (24) at a predetermined interval with a high precision, only by allowing an end of the coil body (25) to be held to the positioning portions (28) formed in the holding member (24).

In the linear motor (R1) of the twelfth aspect, the invention of a fourteenth aspect is characterized in that the positioning portions (28) of the holding member are formed by providing the convex portions (29) at a predetermined interval.

With such a structure, the plurality of coil bodies (25) are positioned with respect to the holding member (24) at a predetermined interval with a high precision, only by allowing an end of the coil body (25) to be held to the positioning portion (28) formed between the convex portions (29).

In the linear motor of the tenth aspect, the invention of a fifteenth aspect is characterized in that in the holding member (24), a notch portion (31) for allowing electric lines to pass therethrough from the plurality of coil bodies (25) is formed.

As described above, by drawing out a wire of the coil body (25) outside the holding member (24) from the notch (31), the coil bodies (25) of the same phase can be connected to each other outside the holding member (24), and wiring can be performed in an orderly manner.

In the linear motor of the tenth aspect, the invention of a sixteenth aspect is characterized in that parts constituting the armature coil unit (23) are partially formed of nonmagnetic and nonconductive materials.

Since these materials have high strengths and small coefficients of linear thermal expansion, deformations that accompany temperature change can be prevented. As a result, the invention can contribute to the stabilization of the performance of the linear motor (R1).

In the linear motor of the sixteenth aspect, the invention of a seventh aspect is characterized in that parts constituting a cooling mechanism for cooling the armature coil unit (23) are partially formed of nonmagnetic and nonconductive materials.

Since these materials have high strengths and small coefficients of linear thermal expansion, the deformations that accompany with a temperature change can be prevented. As a result, the invention can contribute to the stabilization of the performance of the linear motor (R1).

The invention of a eighteenth aspect is a stage mechanism (10) which comprises the linear motor (R1) of the tenth aspect.

With such a structure, in the stage mechanism (10), the linear motor (R1) in which the plurality of coil bodies (25) are positioned with respect to the holding member (24) with a high precision can be provided.

The invention of a nineteenth aspect is an exposure apparatus which comprises the linear motor (R1) of the tenth aspect.

Thus, in the exposure apparatus, the linear motor (R1) in which the plurality of coil bodies (25) are positioned with respect to the holding member (24) with a high precision can be provided.

The invention of a twentieth aspect is a method of manufacturing a linear motor, wherein the armature coil unit (26) is formed by holding the plurality of coil bodies (25) by the frame-shaped holding member (24).

Thus, the linear motor (R1) in which the plurality of coil bodies (25) are positioned with respect to the holding member (24) with a high precision can be provided.

BRIEF DESCRIPTION OF THE DRAWINGS

FIG. 2A is a vertical section view, and FIG. 2B is a transverse section view.

FIG. 10A is a front view of the coil body, and FIG. 10B is a side view thereof FIGS. 11A and 11B are views showing further another example of the coil body used for the linear motor according to the present invention, FIG. 11A is a front view of the coil body, and FIG. 11B is a side view thereof FIG. 12 is a view showing still further another example of the coil body used for the linear motor according to the present invention, FIG. 12A is a front view of the coil body, and FIG. 12B is a side view thereof.

FIG. 14A is a vertical section view of the linear motor, and FIG. 14B is a front view of an armature coil constituting the linear motor.

FIG. 15A is a front view, and FIG. 15B is a plan view.

EMBODIMENTS

The first to fourth embodiments of a linear motor according to the present invention will be described with reference to FIGS. 1 to 12 below.

First Embodiment

Prior to descriptions of the linear motor itself, a projection exposure apparatus comprising the linear motor will be described.

Figure 1:
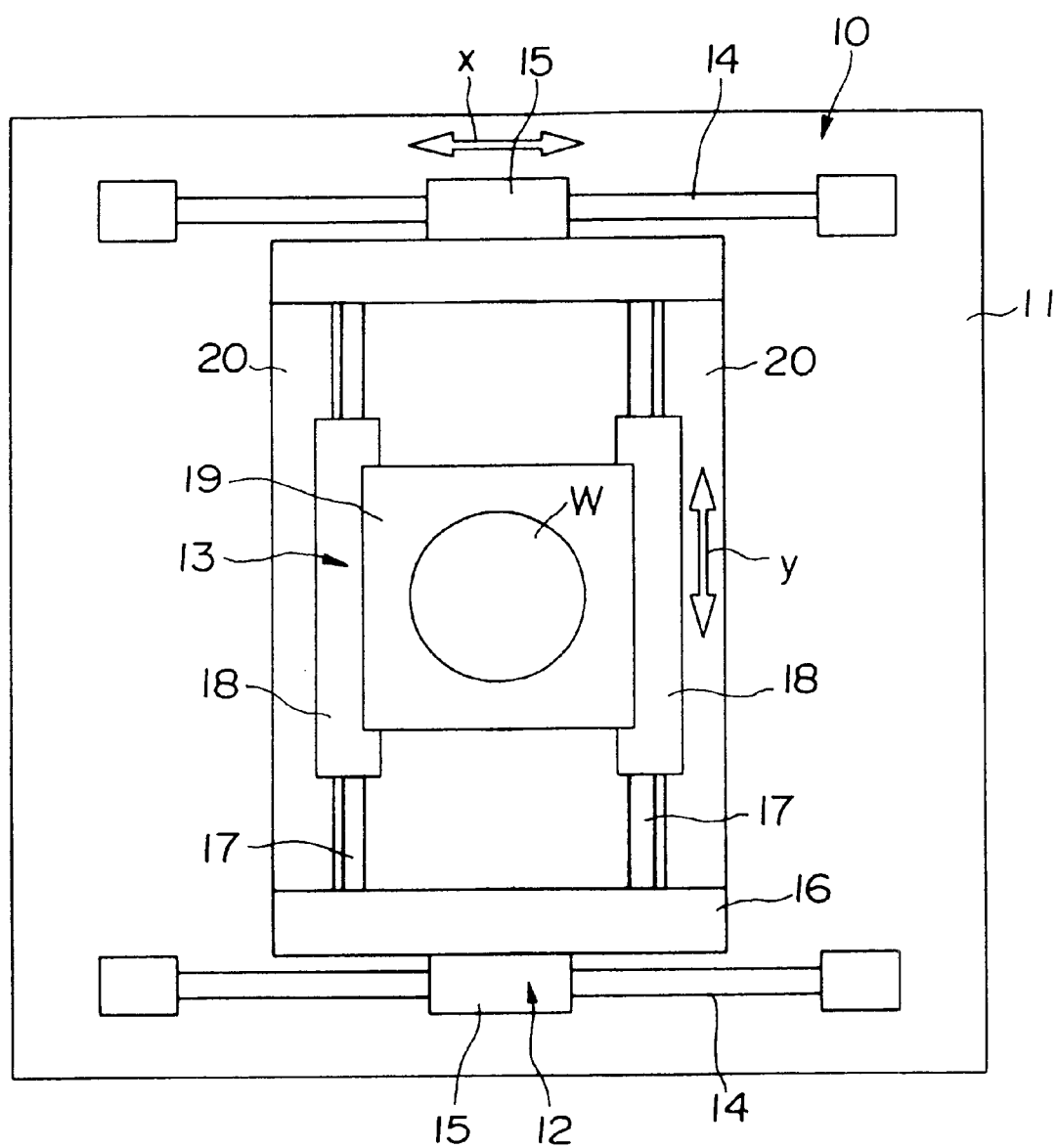
FIG. 1 is a plan view showing a stage mechanism of a projection exposure apparatus comprising a linear motor according to the present invention.

FIG. 1 shows a stage mechanism 10 of the projection exposure apparatus used in photolithography steps of, for example, a semiconductor device. The projection exposure apparatus serves to project and expose via a projection optical system a circuit pattern of a photomask or a reticle onto a substrate such as a wafer or a glass plate, on which photosensitive agent is coated.

A constitution of the projection exposure apparatus is disclosed, for example, in Japanese Patent Unexamined Application, First Publication No. Hei 8-250388 and U.S. Pat. No. 5,777,721 corresponding to this. As long as domestic laws of designated states in this international application or selected states permit, the disclosures in the above publication and the USP are transferred to be incorporated in a part of descriptions of the specification of this application.

As shown in FIG. 1, the stage mechanism 10 serves to hold, move, and position the substrate such as a wafer (hereinafter referred to as a wafer) W, and has a constitution in which an X-stage 12 and a Y-stage 13 are provided on a base 11, which is set onto a pedestal (not shown) via a vibration absorbing mechanism.

The X-stage 12 comprises a pair of fixing rods 14 and 14, which extend along one direction (arrow x-direction in FIG. 1) on a plane perpendicular to an optical axis of a projection optical system of the projection exposure apparatus; movable members 15 and 15, each being movably provided in corresponding one of the rods 14 and 14; and a frame 16 integrally provided in the two movable members 15 and 15, the frame having an almost rectangle shape when viewed from above. With such a structure, the movable members 15 and 15 move along the fixing rods 14 and 14, whereby the frame 16 is made to be freely movable in the axis directions of the fixing rods 14 and 14, that is, in the direction of arrow x in FIG. 1.

The Y-stage 13 comprises a fixing rod 17 extending in a direction perpendicular to the fixing rod 14 on a plane, which is perpendicular to the optical axis of the projection optical system of the projection exposure apparatus, the fixing rod 17 being integrally provided with the frame 16; a movable member 18 provided movably along the fixing rod 17; a holding table 19 integrated with an upper plane of the movable member 18; and guide members 20 and 20 provided on two sides of the frame 16 located on both sides of the fixing rod 17 so as to sandwich the fixing rod 17. The movable member 18 moves along the fixing rod 17, whereby the holding table 19 of this Y-stage 13 is made to be freely movable in the axis direction of the fixing rod 17, that is, the direction of arrow y in FIG. 1. At this time, the holding table 19 is designed such that both ends of the holding table 19 are guided by guide members 20 and 20 formed in the frame 16.

Furthermore, in the holding stage 19, provided are a wafer holder (not shown) for holding the wafer W by suctioning so that the wafer W makes a very small rotation and a leveling mechanism (not shown) for allowing the wafer W held to move upward and downward.

Thus, in the stage mechanism 10, by the X-stage 12 and the Y-stage 13, the holding stage 19 is freely movable in the two directions perpendicular to each other on a plane, which is perpendicular to the optical axis of the projection optical system of the projection exposure apparatus.

A linear motor is used for a driving power source of the X-stage 12 and Y-stage 13 constituting the foregoing stage mechanism 10.

Figure 2B:
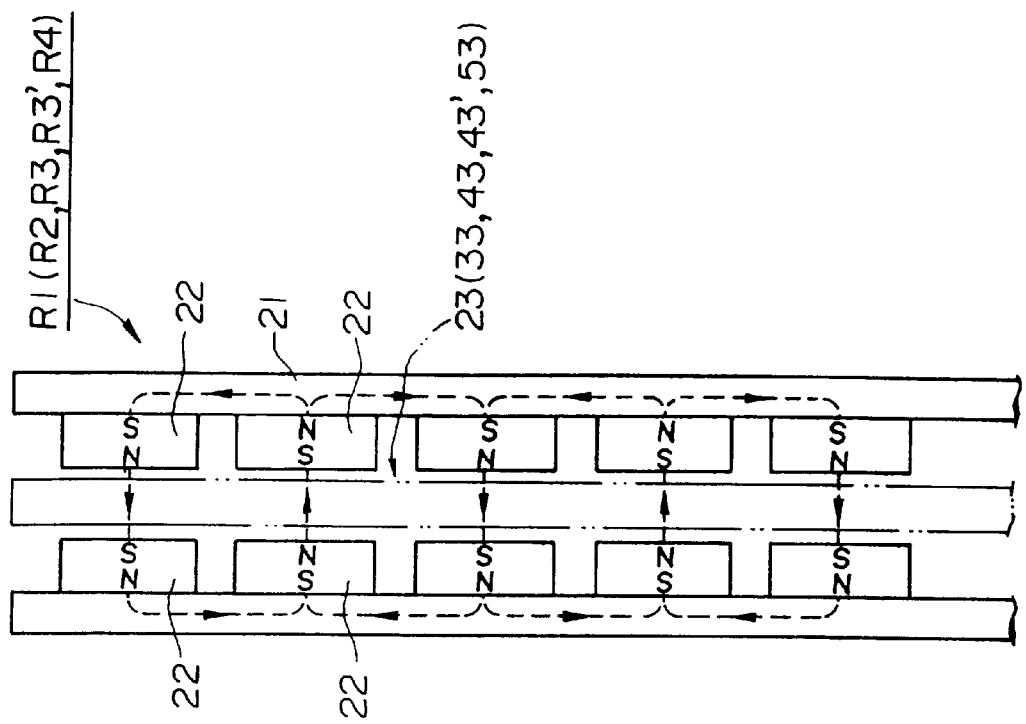
FIGS. 2A and 2B are views showing the linear motor.

As schematically shown in FIG. 2, the linear motor R1 comprises permanent magnets 22 and 22 held by a magnet frame 21 so as to face each other with a predetermined gap therebetween, and an armature coil unit (armature coil) 23 disposed between the permanent magnets 22 and 22.

The armature coil unit 23 is fixed to a coil fixing frame 70, and a can 71, which houses the armature coil unit 23 therein and has an almost box-shape, is integrally provided with the coil fixing frame 70. This can 71 forms a coolant path for cooling the armature coil unit 23, and an inlet port (not shown) and an outlet port (not shown) are formed in the can 71. Coolant supplied from a cooling circulation system (not shown) via the inlet port is made to flow into the inside of the can 71, whereby the armature coil unit 23 is cooled and the coolant is allowed to circulate by returning the coolant to the cooling circulation system from the inlet port (not shown).

Here, the coil fixing frame 70 and the can 71 are formed of ceramics, engineering plastic, or austenite type stainless steel.

Figure 3:
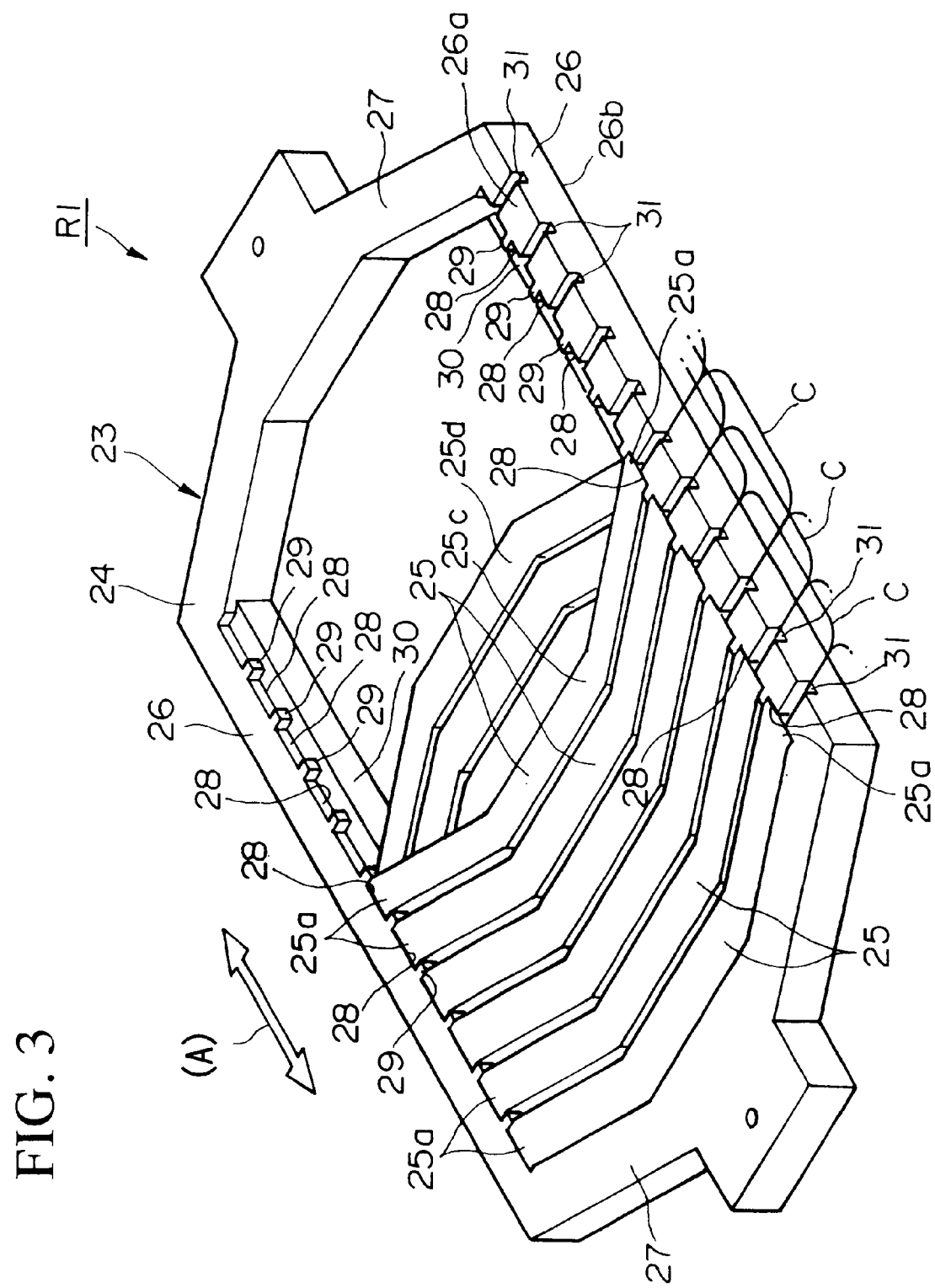
FIG. 3 is a perspective view showing an armature coil constituting the linear motor, which is a first embodiment of the linear motor.
Figure 4:
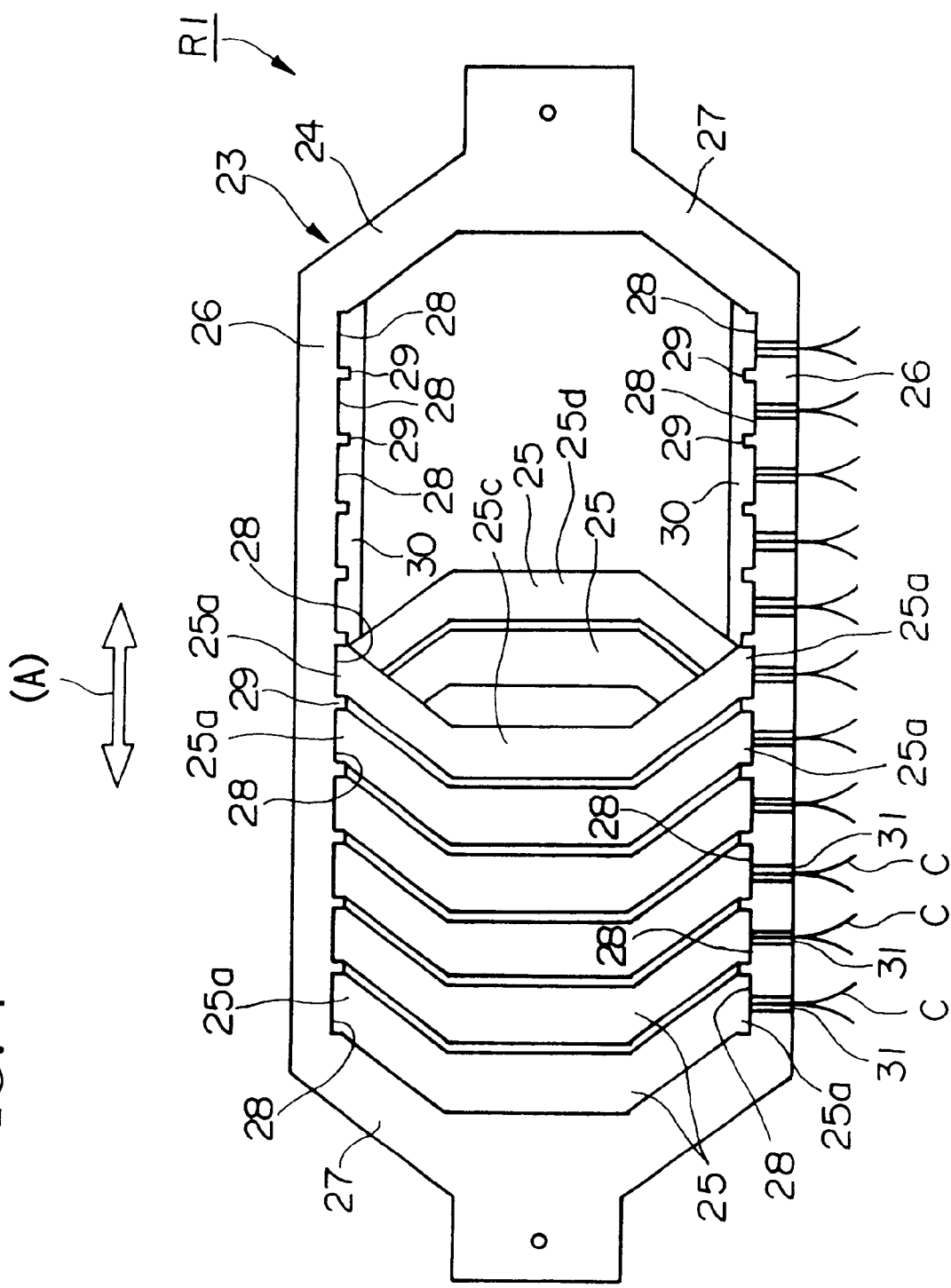
FIG. 4 is a plan view of the armature coil shown in FIG. 3.

As shown in FIG. 3 and FIG. 4, the armature coil unit 23 has a structure in which a plurality of flat coils (coil bodies) 25, 25, . . . , 25 are arrayed in a frame-shaped coil frame (frame) 24 and held thereto.

Here, each flat coil 25 is formed by bending a coil wound to a band shape, and has an approximately hexagonal flat shape of, for example, when viewed from above, or specifically, flat polygon. Each flat coil 25 is positioned on a plane along a direction of relative motion (the arrow (A) direction in FIGS. 3 and 4) of the armature coil unit 23 and the permanent magnet 22 (see FIG. 2), and bent at its ends 25a and 25a positioned on both sides relative to the foregoing relative movement direction. Each end 25a has an external diameter of a shape approximately resembling a square 'C', and formed so that its dimension falls within a previously decided precision.

Figure 2A:
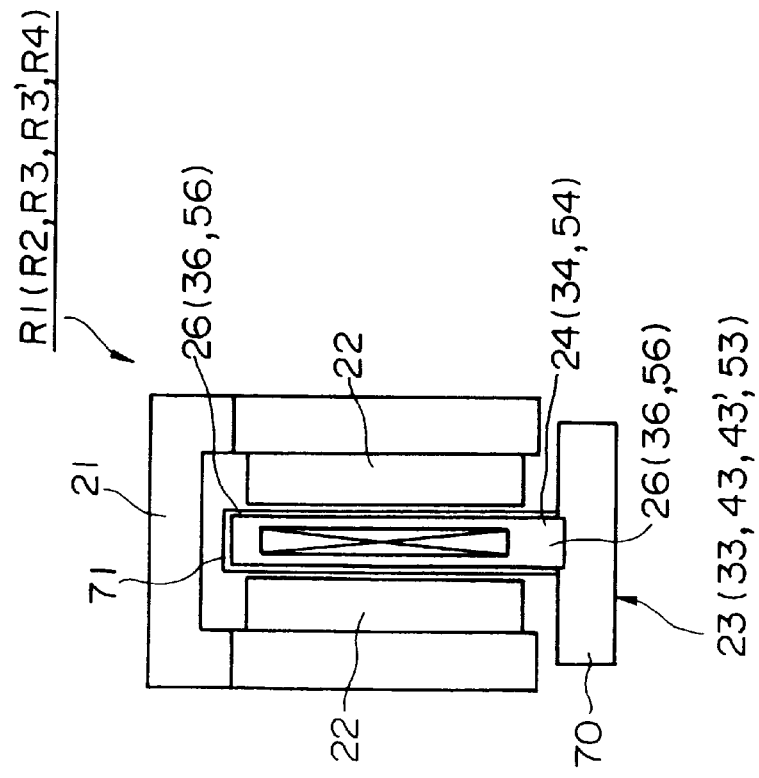

On the other hand, the coil frame 24 is formed of a nonmagnetic and nonconductive (electrically high resistance) material or a material such as ceramics, stainless steel or engineer plastic, and comprises a pair of holding portions 26 and 26 extending along the direction of relative movement of the armature coil unit 23 and the permanent magnet 22 (see FIG. 2), and connection portions 27 and 27 connecting integrally the holding portions 26 and 26 thereto in their both ends. Here, as shown in FIG. 2A, the holding portions 26 and 26 are disposed at positions which do not interfere with magnetic force lines of the permanent magnets 22 and 22.

As shown in FIG. 3 and FIG. 4, on one plane side 26a of each holding portion 26, a plurality of grooves 28, each of which serves as a positioning portion for each flat coil 25, are formed at a predetermined interval corresponding to the array interval of the permanent magnets 22 (see FIG. 2). A plurality of convex portions 29 extending inside the coil frame 24 are formed in the holding portion 26 at a predetermined interval, whereby each groove 28 is in a state where it is formed between the convex portions 29 and 29 adjacent to each other. Each groove 28 is formed in a shape corresponding to the end 25a of the flat coil 25. Moreover, an extending portion 30 extending inwardly further than the convex portion 29 is formed on the other plane side 26b of each holding portion 26.

Furthermore, in one of the two holding portions 26, a slit (notch) 31 for allowing its inner and outer peripheral sides to communicate with each other is formed at a position corresponding to each groove 28 of one plane side 26a of each holding portion 26.

Each flat coil 25 is fitted into the groove 28 in its both ends 25a and 25a, and fixed to the groove 28 and the extending portion 30 by adhesive, resin or the like. In this state, each flat coil 25 is positioned in the direction of relative movement of the armature coil unit 23 by the groove 28, and positioned in the thickness direction of the armature coil unit 23 by the extending portion 30. Moreover, each flat coil 25 is fixed by the convex portion 29 so as not to contact another flat coil 25. Thus, the plurality of flat coils 25 are fitted to the coil frame 24 in such a manner that each flat coil 25 is sequentially disposed so as to be shifted from others at a predetermined interval along the direction of relative movement of the armature coil unit 23, and in the two ends 25a and 25a, one side 25c faces one plane side 26a of the holding portion 26 and the other side 25d faces the other plane side 26b of the holding portion 26.

Furthermore, a wire C extending from one end 25a of each flat coil 25 is guided outside the coil frame 24 from the slit 31, and connected to the other flat coil 25 of the same phase via the slit 31 corresponding to this flat coil 25.

Note that among constituent components constituting the foregoing armature coil unit 23, all of the constituent components including the coil frame 24 except for the flat coil 25 are formed of ceramics, engineering plastic or austenite type stainless steel.

The linear motor is manufactured by connecting the above-described parts functionally (mechanically, electrically).

In the linear motor R1 having the armature coil unit 23 constituted as above, any one of the magnet frame 21 side and the coil frame 24 side shown in FIG. 2 is fixed to the fixing rod 14 of the X-stage 12 and the fixing rod 17 of the Y-stage 13 shown in FIG. 1, and the other is fixed to the movable member 15 of the X-stage 12 and the movable member 18 of the Y-stage 13. By the propulsion of the linear motor R1 generated by the relative movement of the permanent magnets 22 and 22 and the armature coil unit 23, the stage mechanism 10 is driven.

Specifically, the stage mechanism 10 is manufactured by connecting the linear motor, the X-stage 12, the Y-stage 13, and the like, functionally (mechanically, electrically) to assemble them.

In the foregoing linear motor R1, the armature coil unit 23 comprises the plurality of flat coils 25 and the coil frame 24 for holding these, and the coil frame 24 comprises the pair of holding portions 26 and 26 and the connection portion 27 for connecting these holding portions 26 and 26 to each other. Then, in the respective holding portions 26, the grooves 28 for holding the ends 25a of the flat coils 25 are formed at an interval corresponding to the array interval of the permanent magnets 22.

Thus, since each of the plural flat coils 25 is arrayed on the frame-shaped coil frame 24, an efficiency of the linear motor increases. Moreover, only by impacting the end 25a of each flat coil 25 in the groove 28 formed in the holding portion 26 of the coil frame 24 to fix each flat coil 25 to the coil frame 24, each flat coil 25 can be positioned with a high precision, and set without deviation of the array interval of the permanent magnets 22 from the array interval of the flat coils 25. Accordingly, unevenness of the propulsive force generated in the linear motor R1 can be reduced, and performance of the linear motor R1 can be stabilized. In addition, since the holding portion 26 is disposed at the position where the holding portion 26 does not interfere with the magnetic force lines of the permanent magnets 22 and 22, only for the flat coil 25 is interposed between the permanent magnets 22 and 22, resulting in an increase of the performance of the linear motor R1.

Figure 14A:
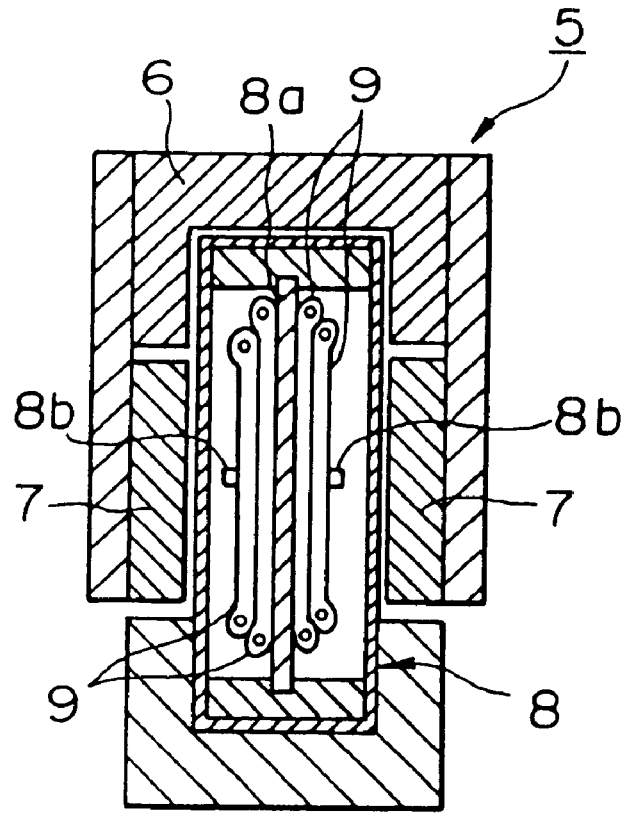
FIGS. 14A and 14B are views showing another example of the conventional linear motor.
Figure 14B:
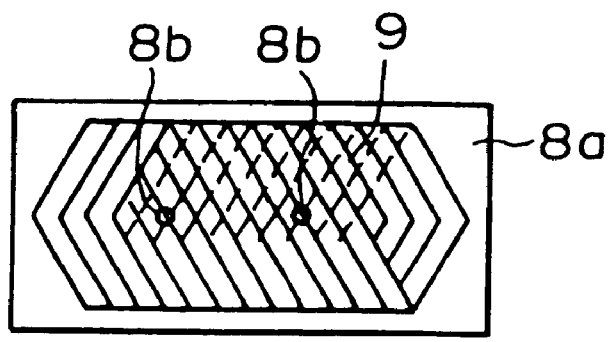
Figure 15A:
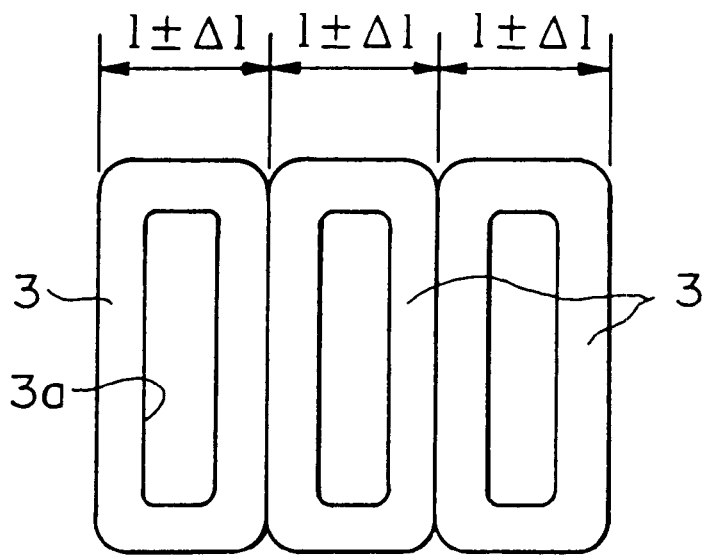
FIGS. 15A and 15B are views showing a deviation of an array interval between a permanent magnet and a coil body in the linear motor shown in FIGS. 13A and 13B.
Figure 15B:
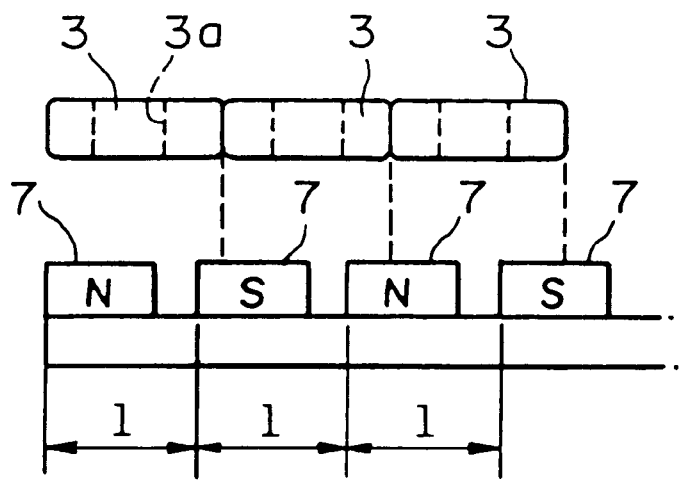

In addition, since the conventional coil 9 having the complicated shape as shown in FIG. 14 is not used, a large scale winding apparatus is unnecessary, and it is possible to obtain the foregoing effect with a low cost. Moreover, since the ends 25a and 25a of the flat coil 25 are fixed to the coil frame 24 so as to be held by the coil frame 24, even the flat coil 25 having the flat shape and low rigidity can obtain high rigidity, and is excellent in durability. In addition, since in the flat coil 25, a precision is required only for the end 25a held by the groove 28, coil manufacture of the flat coil 25 does not require much labor, so that this point can also contribute to a low cost.

Furthermore, in the coil frame 24, the slit 31 is formed so as to correspond to the groove 28, and the wire C from the end 25a of the flat coil 25 held by the groove 28 is made to pass through the slit 31, so that the flat coil 25 is connected thereto outside the coil frame 24.

With such a structure, the flat coils 25 of the same phase can be connected to each other outside the coil frame 24, and wiring can be performed in an orderly manner. Furthermore, since the groove 28 and the slit 31 are formed integrally with each other, a wiring operation can be performed simultaneously with setting the flat coil 25, so that assembly steps of the armature coil unit 23 can be simplified.

Furthermore, in the foregoing linear motor R1, the flat coil 25 is structured to be a flat polygon shape. By using the flat coil 25 as described above, the occupation rate of the flat coil 25 in the gap between the permanent magnets 22 and 22 can be increased, thus increasing the performance of the linear motor R1.

In addition, among constituent components constituting the coil fixing frame 70, the can 71 and the armature coil unit 23, all of the constituent components except for the flat coil 25 are formed of ceramics, engineering plastic, or austenite type stainless steel. Since these materials have high strengths and small coefficients of linear thermal expansion, the deformation that accompanies a temperature change can be prevented, so that this can contribute to the stabilization of the performance of the linear motor R1.

Second Embodiment

Next, a second embodiment of the linear motor according to the present invention will be described. Here, descriptions are made using an example in which two layered armature coils are provided. The linear motor in the second embodiment described below and the linear motor R1 shown in the foregoing first embodiment are different from each other only in the constitution of the armature coil unit, and the constitutions of other constituent components and use of the linear motor are identical. Accordingly, the constituent components common to the foregoing first embodiment are denoted by the same reference numerals, and their descriptions are omitted.

Figure 5:
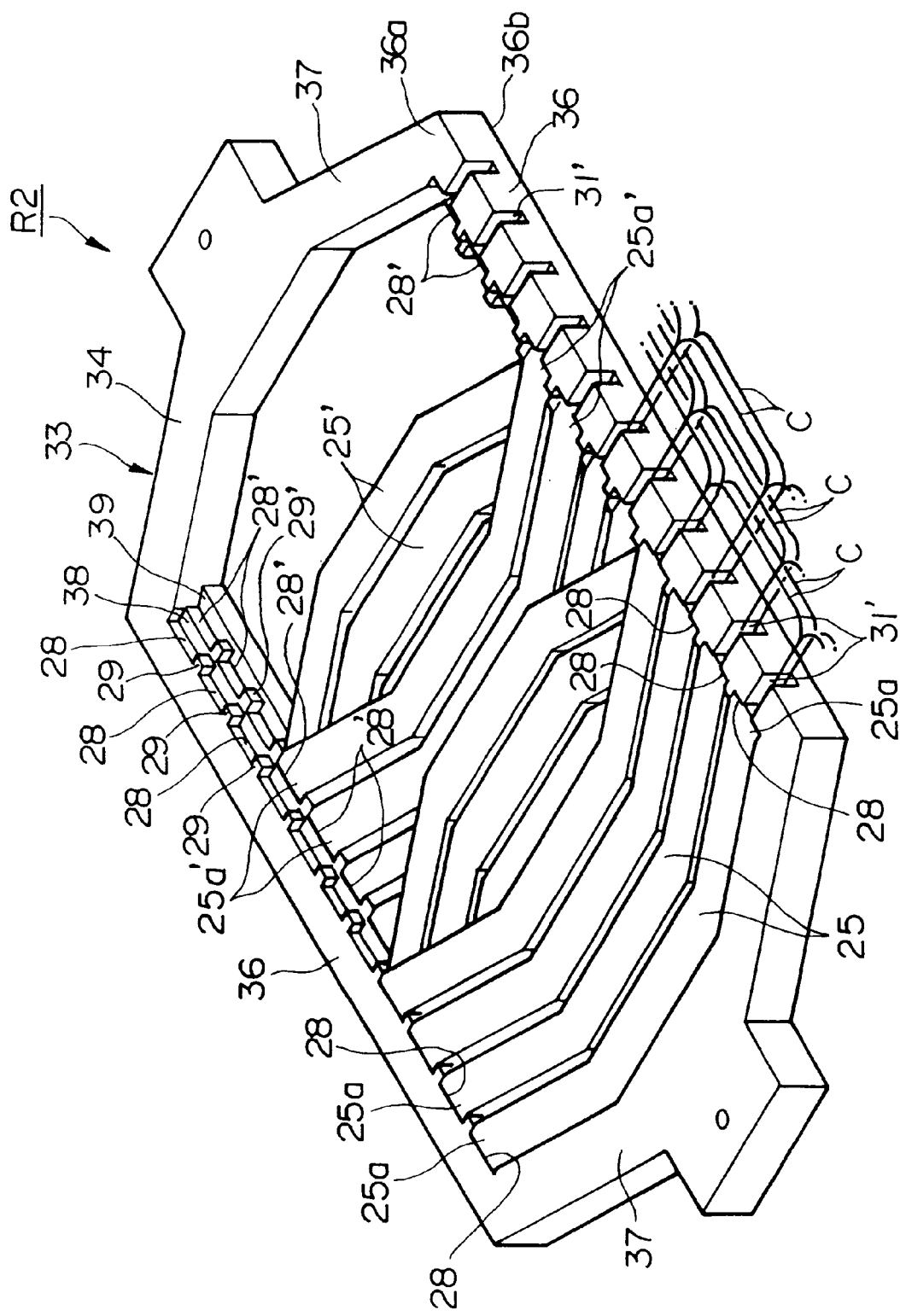
FIG. 5 is a perspective view showing an armature coil constituting the linear motor, which is a second embodiment of the linear motor.

As shown in FIG. 5, an armature coil unit (armature coil) 33 of the linear motor R2 has a structure in which a plurality of flat coils (coil bodies) 25 and 25' are held to a coil frame (frame) 34.

On the other hand, the coil frame 34 is formed of a nonmagnetic and nonconductive (electrically high resistance) material or a material such as ceramics, stainless steel or engineer plastic, and comprises a pair of holding portions 36 and 36 extending along the relative movement direction of the armature coil unit 33 and the permanent magnet 22 (see FIG. 2), and connection portions 37 and 37 connecting integrally the holding portions 36 and 36 thereto in their both ends.

In each holding portion 36, grooves 28 for holding the ends 25a of the flat coils 25 are formed on its one plane side 36a at a predetermined interval corresponding to the array interval of the permanent magnets 22 (see FIG. 2).

Furthermore, in the middle portion in the thickness direction of each holding portion 36, grooves 28' for holding the ends 25a' of the flat coils 25' are formed at a predetermined interval corresponding to the array interval of the permanent magnets 22 (see FIG. 2). Here, in each flat coil 25', an interval between the ends 25a' and 25a' is set to be smaller than that between the ends 25a and 25a of the foregoing flat coil 25. Accordingly, an interval between the grooves 28' and 28' facing each other is set to be smaller than that between the grooves 28 and 28. Thus, when each holding portion 36 is viewed in its thickness direction laterally, it is understood that a step portion 38 is formed between the groove 28 and the groove 28'.

Then, an extending portion 39 extending inwardly further than the convex portion 29' for forming the groove 28' is formed on the other plane side 36b of each holding portion 36.

Furthermore, in one of the holding portions 36, a slit (notch) 31' for allowing its inner and outer peripheral sides to communicate with each other is formed at a position correspond to each of the grooves 28 and 28'.

In the coil frame 34, the plurality of flat coils 25' are fixed to the grooves 28' and 28' by adhesive, resin, or the like.

Figure 6:
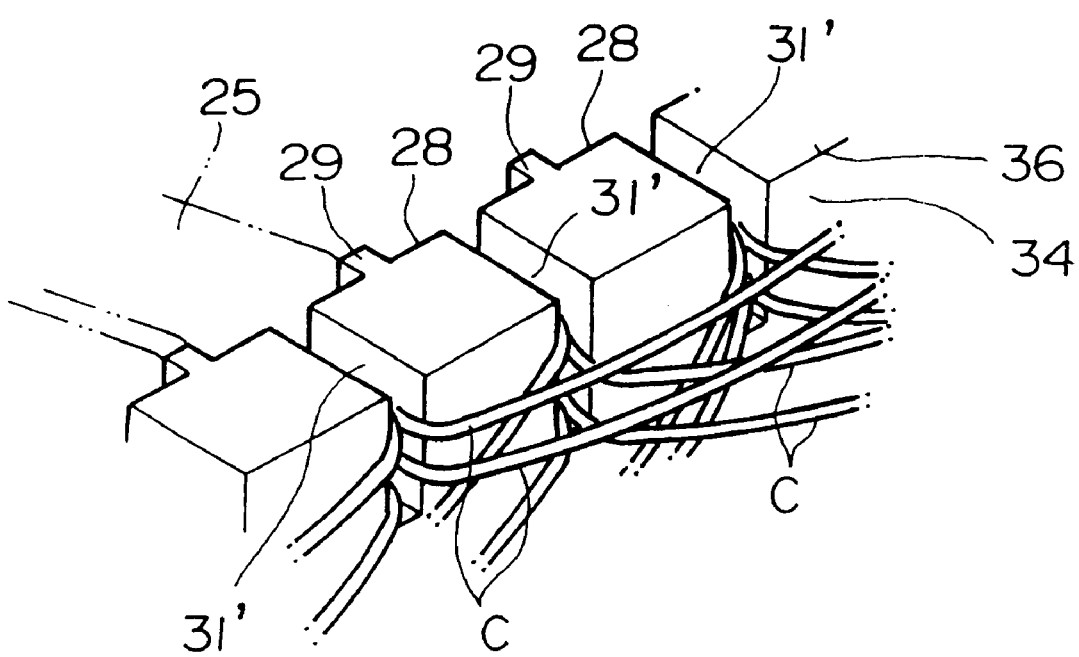
FIG. 6 a perspective view showing a wire in the armature coil shown in FIG. 5

Furthermore, the flat coils 25 are fixed to the grooves 28 and 28 by adhesive, resin or the like so as to be superimposed on the respective flat coils 25'. Furthermore, as shown in FIGS. 5 and 6, wires C extending from one end 25a and 25a' of each flat coil 25 and 25' are guided outside the coil frame 34 from the slits 31', and connected to the other flat coils 25 and 25' of the same phase.

As described above, the flat coils 25 and 25' are fitted to the coil frame 34 so as to be double layered, and the linear motor R2 has so called a two-layered structure.

Note that among constituent components constituting the foregoing armature coil unit 33, all of the constituent components including the coil frame 34 except for the flat coils 25 and 25' are formed of ceramics, engineering plastic, or austenite type stainless steel.

In the foregoing linear motor R2, the same effect as that of the linear motor R1 in the foregoing first embodiment can be exerted.

In addition, the foregoing linear motor R2 has a structure in which the step portion 38 is formed in the coil frame 34, and the grooves 28 and 28'for holding the flat coils 25 and 25' so as to layer them upon another are formed. Thus, the linear motor R2 can be structured to a two-layered structure, and its performance can be increased.

Third Embodiment

Next, a third embodiment of the linear motor according to the present invention will be described. Here, descriptions are made using, an example in which two armature coils layered are provided to the linear motor similarly to the foregoing second embodiment. The linear motor in the third embodiment described below and the linear motor R1 shown in the foregoing first embodiment are different from each other only in the constitution of the armature coil unit, and the same in the constitutions of other constituent components and use of the linear motor. Accordingly, the constituent components common to the foregoing first embodiment are denoted by the same reference numerals, and descriptions for them are omitted.

Figure 7:
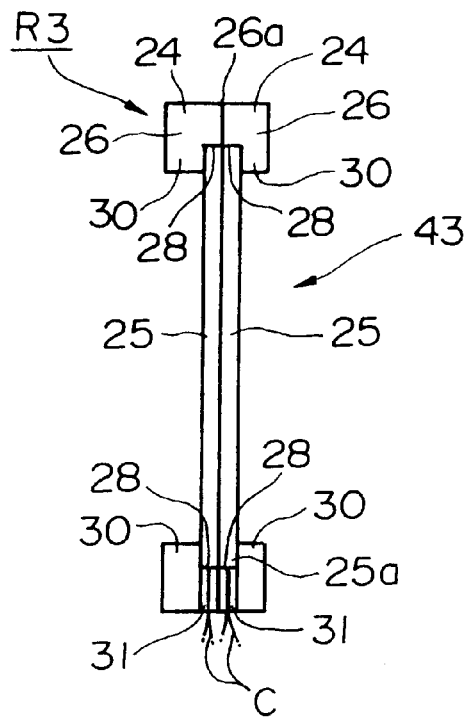
FIG. 7 is a vertical section view showing an armature coil constituting the linear motor, which shows a third embodiment of the linear motor.

As shown in FIG. 7, the armature coil unit (armature coil) 43 of the linear motor R3 has a structure in which the two coil frames 24 (see FIG. 4) shown in the foregoing first embodiment are combined. Specifically, in a state where one plane side 26a of the holding portion 26 of each coil frame 24 faces the other side 26a thereof, these two coil frames 24 are jointed integrally with each other by a jointing means such as adhesive. In the holding portions 26 of the respective coil frames 24, the grooves 28 are formed at a predetermined interval, and the flat coils 25 are fixed to the respective grooves 28. Furthermore, the wire C connected to the end 25a of each flat coil 25 is guided outside of the coil frame 24 from the slit 31 formed so as to correspond to each groove 28, and connected to another flat coil 25 of the same phase.

In the linear motor R3 as described above, the same effect as that of the linear motor R1 shown in the foregoing first embodiment can be obtained.

Furthermore, the linear motor R3 has a structure in which the two coil frames 24 are glued together with each other. Thus, the linear motor R3 can be structured to a two-layered structure in which the two flat coils 25 are layered. Also with such a structure, an increase in the performance can be achieved similarly to the foregoing second embodiment.

Figure 8:
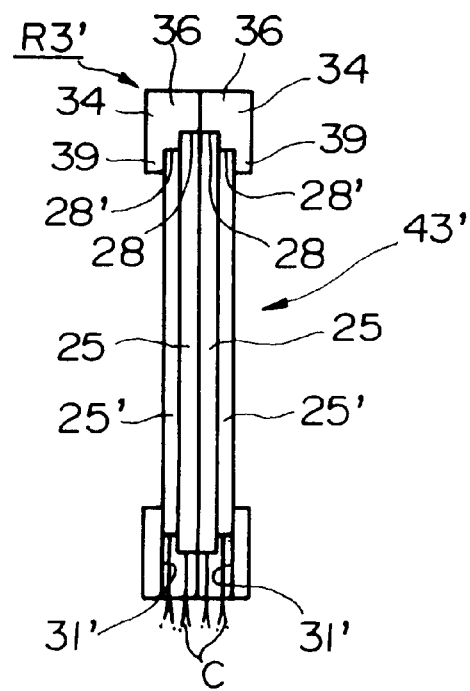
FIG. 8 is a vertical section view showing another example of the armature coil shown in the third embodiment.

Although, in the foregoing third embodiment, the armature coil unit 43 of the linear motor R3 is constituted by combining the two coil frames 24 shown in the foregoing first embodiment, other structures may be adopted as long as the armature coil unit 43 is constituted by jointing the plurality of frames to each other. For example, as shown in FIG. 8, the armature coil unit (armature coil) 43' of the linear motor R3' is constituted by jointing the coil frames 34 (see FIG. 5) shown in the second embodiment, and thus the linear motor R3' can be formed into a structure in which four flat coils 25 and 25' in total are layered. As a matter of course, the linear motor R3' may adopt a structure in which three or more frames are jointed to each other.

Fourth Embodiment

Next, a fourth embodiment of the linear motor according to the present invention will be described. Here, an example in which the conventional non-flat coil body is used as the coil body of the armature coil of the linear motor will be described. In the fourth embodiment described below, the constituent components common to those of the foregoing first to third embodiments are denoted by the same reference numerals, and descriptions for them are omitted.

Figure 9A:
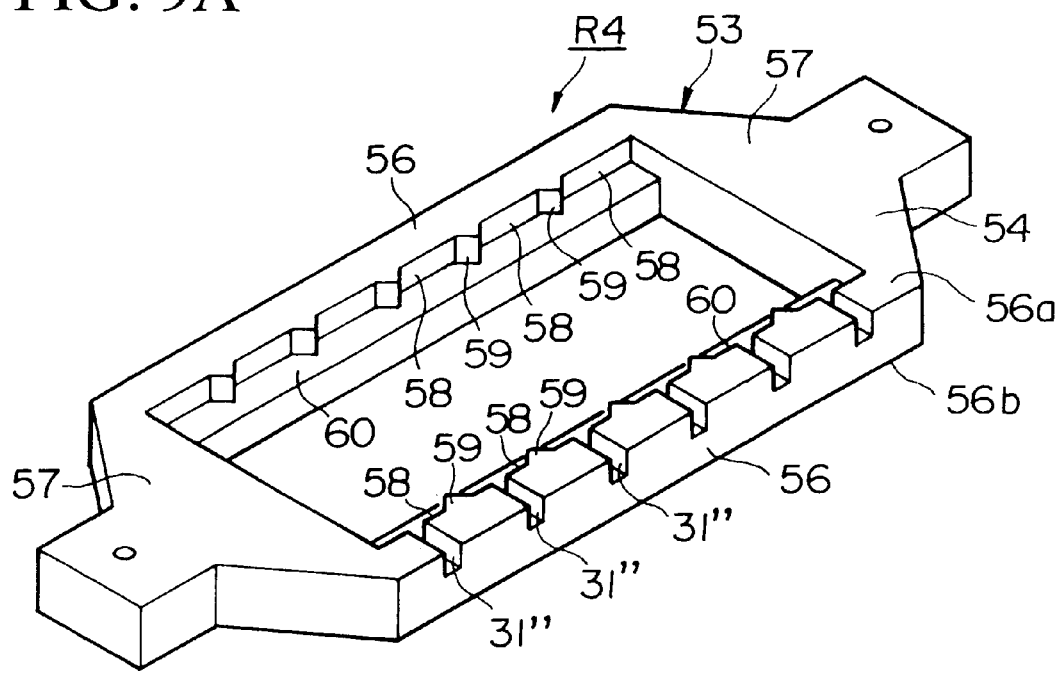
FIGS. 9A and 9B are perspective views showing an armature coil constituting the linear motor, which are a fourth embodiment of the linear motor.
Figure 9B:
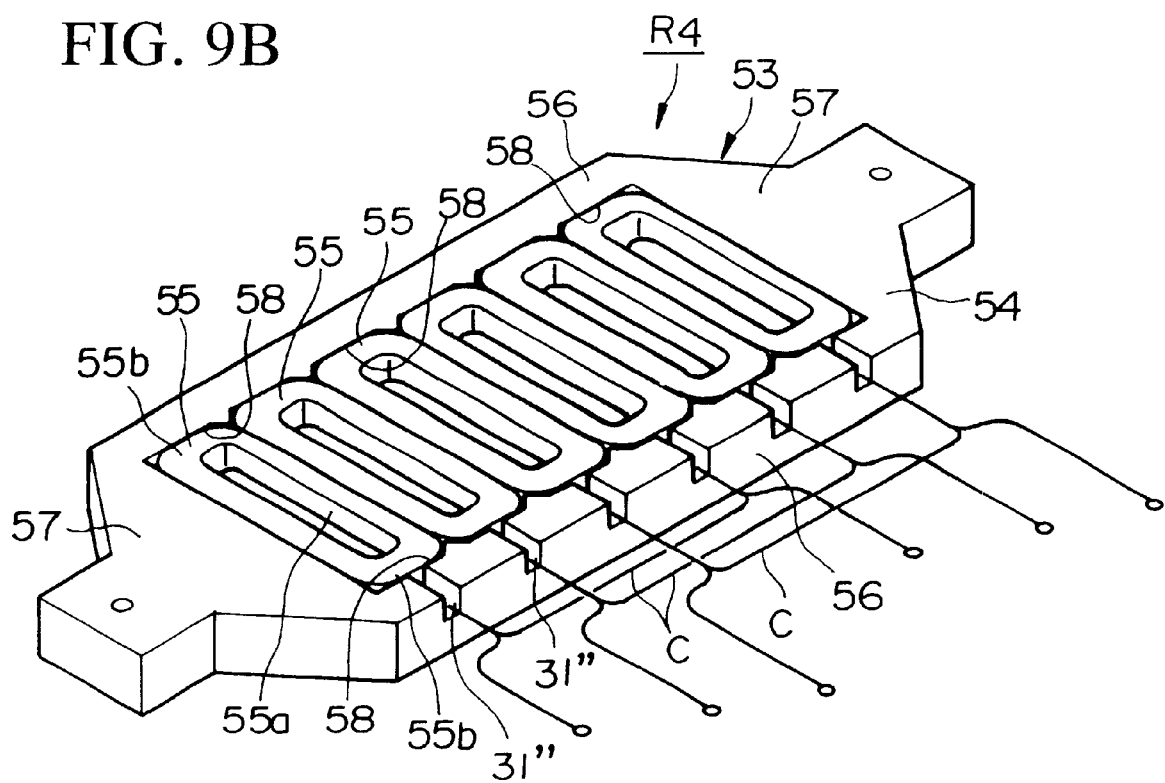

As shown in FIG. 9, an armature coil unit (armature coil) 53 of a linear motor R4 has a structure in which a plurality of coil bodies 55, 55, . . . are arrayed in a coil frame (frame) 54 and held thereto.

Figure 13:
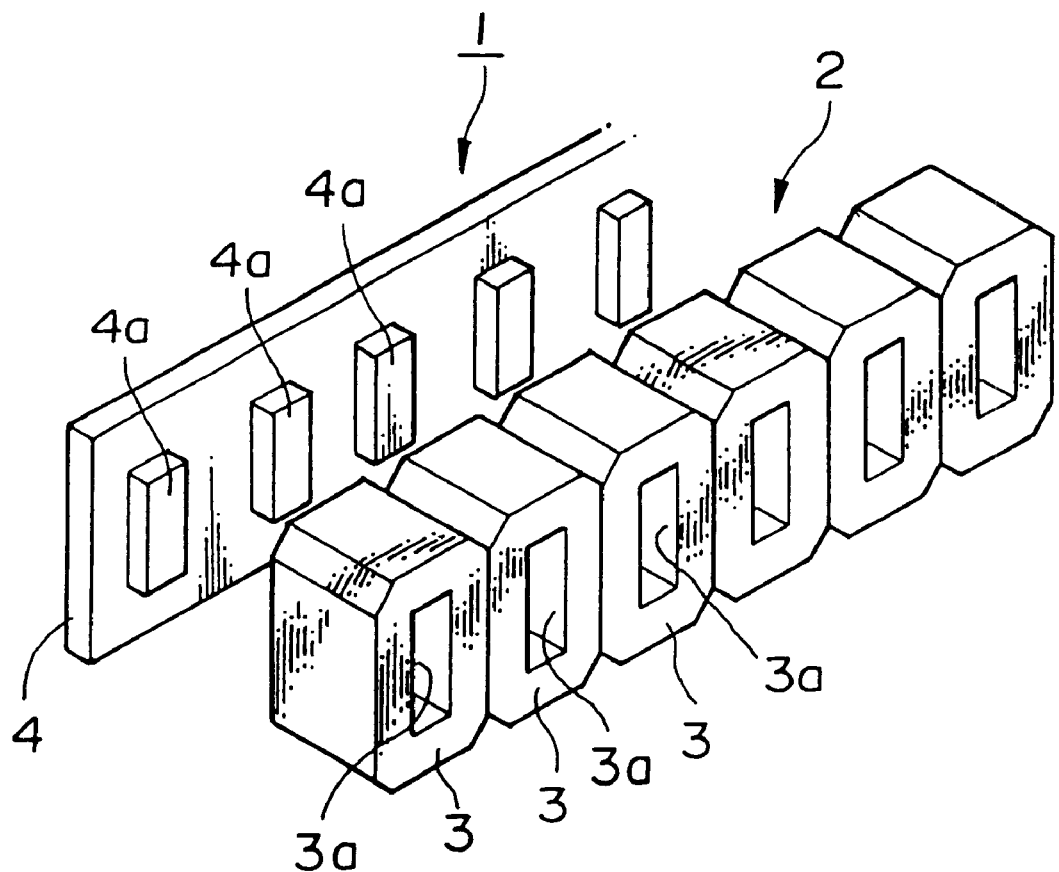
FIG. 13 is a view showing an example of a conventional linear motor, which is a perspective view showing an armature coil of the linear motor.

Here, the coil body 55 is constructed by winding a wire to an almost rectangular shape when viewed sideways similarly to the foregoing coil body 3 (see FIG. 13) shown in the prior art, and has an opening portion 55a in its central portion.

On the other hand, the coil frame 54 is formed of a nonmagnetic and nonconductive (electrically high resistance) material or a material such as ceramics, stainless steel or engineer plastic, and constituted of a pair of holding portions 56 and 56 extending along the relative movement direction of the armature coil unit 53 relative to the permanent magnet 22 (see FIG. 2), and connection portions 57 and 57 connecting integrally the holding portions 56 and 56 thereto in their both ends.

On one plane side 56a of each holding portion 56, a plurality of grooves 58 are formed at a predetermined interval corresponding to the array interval of the permanent magnets 22 (see FIG. 2). The grooves 58 are formed by forming a plurality of convex portions 59 extending inside the coil frame 54 in the holding portion 56. Each groove 58 is formed so as to correspond to the end 55b of the coil bodies 55. Furthermore, on the other plane side 56b of each holding portion 56, an extending portion 60 extending inwardly further than the convex portion 59 is formed.

Furthermore, in one of the two holding portions 56, a slit (notch) 31" for allowing its inner and outer peripheral sides to communicate with each other is formed at a position corresponding to each groove 58 on one plane side 56a.

Thus, each coil body 55 is fitted into the groove 58 in its ends 55a and 55a, and fixed by adhesive, resin, or the like. Thus, the plurality of coil bodies 55 are arranged in the coil frame 54 at a predetermined interval along the relative movement direction of the armature coil unit 23. Then, a wire C extending from one end 55a of each coil body 55 is guided outside the coil frame 54 from the slit 31", and connected to another coil body 55 of the same phase.

Note that among constituent components constituting the foregoing armature coil unit 53, all of the constituent components including the coil frame 54, except for the coil body 55, are formed of ceramics, engineering plastic, or austenite type stainless steel.

In the foregoing linear motor R4, the grooves 58 holding the coil bodies 55, are formed in the holding portions 56 and 56 of the coil frame 54 of the armature coil unit 53 at an interval corresponding to the array interval of the permanent magnets 22.

With such a structure, even when the coil body 55 is the conventional type, it is possible to position each coil body 55 with a high precision, and unevenness of propulsive force generated in the linear motor R4 can be lessened, so that performance can be stabilized.

Note that besides the constitutions cited in the first to fourth embodiments, other constitutions can be properly adopted as along as they do not apart from the scope of the present invention.

For example, the numbers of the flat coils 25 and 25' and the coil bodies 55, which constitute the armature coil units 23, 33, 43, 43' and 53, are not limited at all.

Figure 10A:
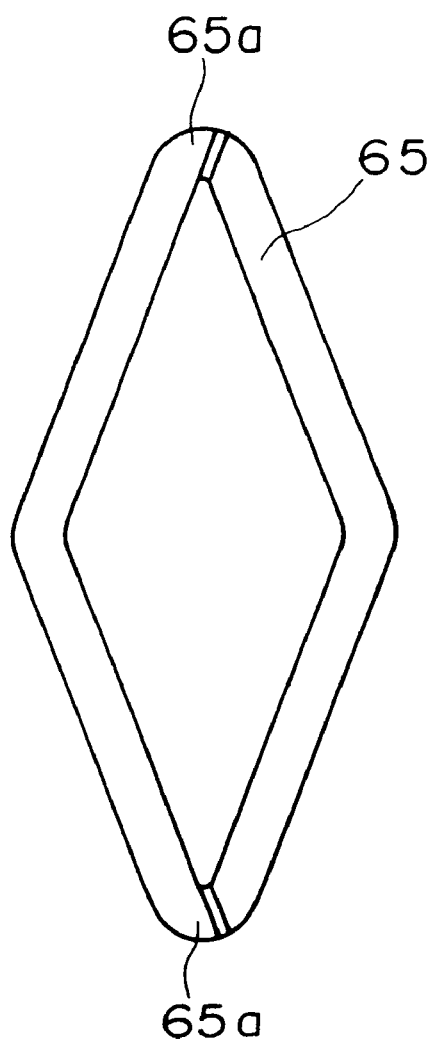
FIGS. 10A and 10B are views showing another example of a coil body used for a linear motor according to the present invention.
Figure 10B:
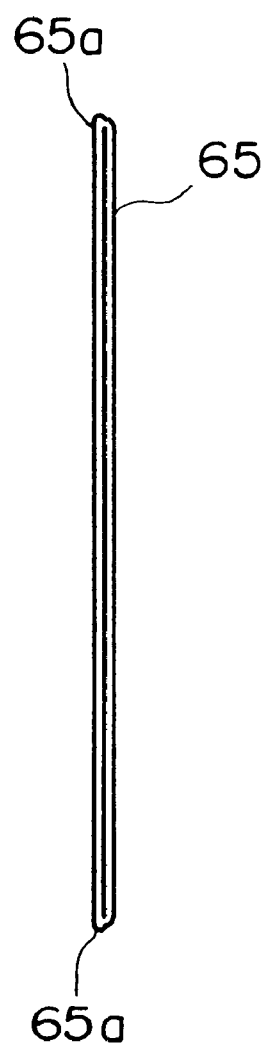

Also the shapes of the flat coils 25 and 25' and the coil body 55 are not limited to the above-described ones, and other shapes may be adopted. For example, instead of the flat coils 25 and 25', the almost rhombus-shaped flat coil (coil body) 65 having a curve-shaped end 65a as shown in FIG. 10, the almost rhombus-shaped flat coil (coil body) 66 having an almost trapezoid-shaped end 66a as shown in FIG. 11, the flat coil (coil body) 67 having an almost hexagon shape as shown in FIG. 12 when viewed from the above, the end 67a of which is not an approximately square C shape unlike the end 25a (see FIG. 4) of the foregoing flat coil 25 and bent to be almost trapezoidal, and the like may be adopted. In such a case, it is natural that the shape of the groove should conform to that of the end of the coil body used.

Constitutions of the parts other than the armature coil units 23, 33, 43, 43' and 53 of the linear motors R1, R2, R3, R3' and R4 are not limited at all, and other constitutions may be properly adopted. Any of the armature coil units 23, 33, 43, 43' and 53 and the permanent magnet 22 may be used as a rotor or a stator.

Furthermore, constitutions of other parts of the exposure apparatus comprising the foregoing linear motors R1, R2, R3, R3' and R4 are not limited at all. Moreover, as the exposure apparatus, the one adopting the step and repeat system was cited as the example, and the technique of the present invention can be also applied to a scan type projection exposure apparatus similarly, which moves a reticle and a wafer synchronously and exposes a pattern of the reticle. The constitution of the scan type exposure apparatus is disclosed, for example, in Japanese Patent Unexamined Patent Application, First Publication No. Hei 8-130179 and U.S. Pat. No. 5,850,280 corresponding to this. As long as domestic laws of designated states in this international application or selected states therein permit, the disclosures in the above gazette and the USP are incorporated in a part of descriptions of the specification of this application. Furthermore, a category of the exposure apparatus is not limited to the one for use in semiconductor manufactures, and the technique of the present invention can be applied widely to exposure apparatuses for liquid crystals, which expose a liquid crystal display device pattern onto a square-shaped glass plate, and exposure apparatuses for manufacturing thin film magnetic heads.

As a matter of course, the linear motors R1, R2, R3, R3' and R4 can be applied to various kinds of uses other than the driving power source of the stage mechanism of the exposure apparatus.

Besides these, any constitution may be adopted if this does not depart from the spirit and scope of the present invention. As a matter of course, selective combinations of the above-described constitutions may be used properly.

Possibility of Industrial Use

As described above, according to the linear motor of the first aspect of the present invention, the armature coil comprises the plurality of coil bodies and a frame for holding these coil bodies, and the grooves for holding the ends of the respective coil bodies are formed in the frame at a determined interval. With such a structure, the ends of the coil bodies are held to the grooves formed in the frame, whereby the plurality of coil bodies are positioned with respect to the frame at a predetermined interval with a high precision. Accordingly, it is possible to reduce unevenness of propulsive force generated in the linear motor, and thus the stabilization of the performance can be achieved. In addition, a coil body having a complicated shape is not used, so that the foregoing effect can be obtained at a low cost. Moreover, since the end of the coil body is held by the frame, it is possible to exert an effect that a high rigidity can be obtained even when the coil body itself, such as the coil having the flat shape, shows a low rigidity, and the coil body is excellent in durability. In addition, since precision is required for only the portion of the coil body held by the groove, the coil manufacture is simplified, so that the present invention can contribute to a low cost of the linear motor.

The notch is formed in the frame defined by the second aspect of the present invention, and the coil bodies are connected to each other outside the frame.

As described above, by drawing out the wire of the coil body from the notch outside the frame, the coil bodies of the same phase can be connected to each other outside the frame, and a wiring operation can be performed in an orderly manner.

According to the linear motor of the third aspect of the present invention, the notch is formed so as to correspond to the groove formed in the frame, and allows the wire from the end of the coil body held to the groove to pass therethrough.

With such a structure, since the notch is formed for each coil body, setting of the coil body and the wiring operation can be performed simultaneously, and hence an assembly of the armature coil can be simplified.

According to the linear motor of the fourth aspect of the present invention, the step portion for holding the plurality of coil bodies superimposed is formed in the groove. With such a structure, the plurality of coil bodies can be held by one frame so as to be superimposed, and hence performance of the linear motor can be improved.

According to the linear motor of the fifth aspect of the present invention, the armature coil is constructed by gluing the plurality of frames together. Also with such a structure, the plurality of coil bodies are superimposed, and thus performance of the linear motor can be improved.

According to the linear motor of the sixth aspect of the present invention, the coil body is constructed as a flat polygon. As described above, by constructing the coil body as the flat shape, the occupation rate of the armature coil in the gap of the permanent magnet can be increased, and performance of the linear motor can be improved.

According to the linear motor of the seventh aspect of the present invention, the coil body is constructed as a shape obtained by performing winding which is substantially cylindrical. Thus, also in the coil body having a shape obtained by performing winding which is substantially cylindrical, that is, in the conventional type of coil body, the positioning precision of the coil body can be increased similarly to the case of the above-described linear motor, and the stabilization of the performance of the linear motor can be achieved.

According to the linear motor of the eighth aspect of the present invention, the frame has the pair of holding portions and the connection portion for connecting these holding portions to each other, and the plurality of grooves are formed in the respective holding portion at an interval corresponding to the array interval of the permanent magnets.

With such a structure, the coil bodies are held between the pair of holding portions, and the coil bodies are set without allowing the array interval of the permanent magnets and the array interval of the coil bodies to deviate from each other. Accordingly, the stabilization of the performance of the linear motor can be achieved. In addition, by locating the holding portions at positions which do not interfere with the magnetic force lines of the permanent magnets, only the coil body is interposed between the permanent magnets, resulting in an increase of the performance of the linear motor.

According to the linear motor of the ninth aspect of the present invention, among constituent components constituting the coil fixing frame, the can and the armature coil, all of the constituent components except for the coils are formed of ceramics, engineering plastic, or austenite type stainless steel. Since these materials have high strengths and small coefficients of linear thermal expansion, deformation that accompanies a temperature change can be prevented, so that this can contribute to the stabilization of the performance of the linear motor.

The linear motor of the tenth aspect of the present invention comprises the armature coil unit having the plurality of coil bodies and the frame-shaped holding member for holding these coil bodies so as to array the coil bodies. With such a structure, the plurality of coil bodies are positioned to the holding member with a high precision.

The linear motor of the eleventh aspect of the present invention has the feature in that the holding member holds the plurality of coil bodies along a predetermined direction. Thus, the plurality of coil bodies are positioned with respect to the holding member along the predetermined direction with a high precision.

The linear motor of the twelfth aspect of the present invention has a feature in that the holding member has positioning portions formed at a predetermined interval to position the plurality of coil bodies. Accordingly, the plurality of coil bodies are positioned with respect to the holding member at the predetermined interval with a high precision.

According to the linear motor of the thirteenth aspect of the present invention, by holding the end of the coil body to the positioning portion formed in the holding member, the plurality of coil bodies can be positioned to the holding member at the predetermined interval with a high precision.

In the linear motor of the fourteenth aspect of the present invention, the positioning portion is formed by providing the convex portions at a predetermined interval, and, by holding the end of the coil body to the positioning portion formed in the holding member, which is formed between the convex portions, the plurality of the coil bodies can be positioned to the holding member at a predetermined interval with a high precision.

In the linear motor of the fifteenth aspect of the present invention, a notch for allowing the electrical lines to pass therethrough is formed, and the wire of each coil body is drawn out from the notch outside the holding member, this makes it possible to connect the coil bodies of the same phase to each other outside the holding member, and to perform wiring in an orderly manner.

In the linear motor of the sixteen aspect of the present invention, the parts of the armature coil unit are partially formed of nonmagnetic and nonconductive materials, and since these materials have high strengths and small coefficients of linear thermal expansion, deformation that accompanies a temperature change can be prevented. As a result, this can contribute to the stabilization of performance of the linear motor.

In the linear motor of the seventeenth aspect of the present invention, the parts of the cooling mechanism for cooling the armature coil unit are partially formed of nonmagnetic and nonconductive materials, and since these materials have high strengths and small coefficients of linear thermal expansion, deformation that accompanies a temperature change can be prevented. As a result, this can contribute to the stabilization of performance of the linear motor.

The invention of the eighteenth aspect of the present invention is the stage mechanism comprising the linear motor of the tenth aspect of the present invention, and can provide the stage mechanism comprising the linear motor in which the plurality of coil bodies are positioned with a high precision.

The invention of the nineteenth aspect of the present invention is the exposure apparatus comprising the linear motor of the tenth aspect of the present invention, and can provide the exposure apparatus comprising the linear motor in which the plurality of coil bodies are positioned with a high precision.

According to the method of manufacturing the linear motor of the twentieth aspect of the present invention, the linear motor in which the plurality of coil bodies are positioned with a high precision can be manufactured.

What is claimed is:

1. A linear motor that allows a movable body to move by an electromagnetic force, the linear motor comprising:
   an armature coil comprising:
   a plurality of coil bodies; and
      a frame that holds the plurality of coil bodies so as to array the plurality of coil bodies in one direction;
      a positioning portion that holds an end of each of said plurality of coil bodies at a predetermined interval along said one direction being formed in said frame; and
      a notch that passes a wire of each of said plurality of coil bodies therethrough is formed in said frame, wherein said plurality of coil bodies are connected to each other outside of said frame.

2. The linear motor according to claim 1 wherein said notch is formed so as to correspond to said positioning portion formed in said frame, and allows a wire from the end of said coil body held by said positioning portion to pass therethrough.

3. The linear motor according to claim 1, wherein a step portion that holds the plurality of coil bodies so as to superimpose them thereon is formed in said positioning portion.

4. The linear motor according to claim 1, wherein said armature coil is formed by gluing a plurality of the frames to each other.

5. The linear motor according to claim 1, wherein said coil body has a flat polygon shape.

6. The linear motor according to claim 1, wherein said plurality of coil bodies have a shape obtained by performing winding that is substantially cylindrical.

7. The linear motor according to claim 1, wherein:
   said frame has a pair of holding portions extending along said one direction so as to be separated from each other by a predetermined interval, and a connection portion that connects these holding portions to each other in both ends thereof; and said plurality of positioning portions are formed in each of said holding portions at an interval corresponding to an array interval of permanent magnets.

8. The linear motor according to claim 1, wherein, among constituent components comprising:

a coil fixing frame that holds said armature coil;

a can that forms a coolant path to cool said plurality of coil bodies; and said armature coil, all of the constituent components, except for said plurality of coil bodies are formed of at least one of a ceramic, an engineering plastic and an austenite type stainless steel.

9. A linear motor which allows a movable body to move by an electromagnetic force, the linear motor comprising:

an armature coil unit having a plurality of coil bodies; and a frame-shaped holding member that holds the plurality of coil bodies so as to array the plurality of coil bodies along a predetermined direction, wherein said holding member has positioning portions formed at a predetermined interval to position said plurality of coil bodies.

10. The linear motor according to claim 9, wherein the positioning portions of said holding member are formed so as to conform to a shape of an end of each of said plurality of coil bodies.

11. The linear motor according to claim 9, wherein the positioning portions of said holding member are formed by providing convex portions at a predetermined interval.

12. The linear motor according to claim 9, wherein in said holding member, a notch portion that allows electric lines to pass therethrough from said plurality of coil bodies is formed.

13. The linear motor according to claim 9, wherein parts constituting said armature coil unit are partially formed of a nonmagnetic and a nonconductive material.

14. The linear motor according to claim 13, wherein parts constituting a cooling mechanism that cools said armature coil unit are partially formed of nonmagnetic and nonconductive materials.

15. A stage mechanism comprising the linear motor defined by claim 9.

16. An exposure apparatus comprising the linear motor defined by claim 9.

* * * * *